United States Patent
Hung (10) Patent No.: US 7,033,709 B2
(45) Date of Patent: Apr. 25, 2006

(54) METHOD AND STRUCTURE FOR FABRICATING PATTERNS ON PHASE SHIFT MASK FOR THE MANUFACTURE OF SEMICONDUCTOR WAFERS

(75) Inventor: Chi-Yuan Hung, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 122 days.

(21) Appl. No.: 10/701,035

(22) Filed: Nov. 3, 2003

(65) Prior Publication Data

US 2005/0069783 A1    Mar. 31, 2005

(30) Foreign Application Priority Data

Sep. 29, 2003    (CN) ................................. 03151440

(51) Int. Cl.
*G01F 9/00* (2006.01)
*G03C 5/00* (2006.01)

(52) U.S. Cl. .......................................... 430/5; 430/311
(58) Field of Classification Search .................. 430/5, 430/311–313, 394
See application file for complete search history.

(56) References Cited

U.S. PATENT DOCUMENTS 6,139,992 A * 10/2000 Chen et al. ..................... 430/5
6,821,684 B1 * 11/2004 Yang et al. ..................... 430/5

* cited by examiner

*Primary Examiner*—S. Rosasco
(74) *Attorney, Agent, or Firm*—Townsend, Townsend & Crew LLP (57) ABSTRACT

A reticle structure for integrated circuit device. The structure includes a transparent substrate having a surface region and a plurality of spaced regions on the surface region. Each of the spaced regions is configured to form an array, which has a plurality of rows that intersect a plurality of columns. Each of the spaced regions is defined within a pair of rows and a pair of columns; whereupon each of the spaced regions being separated by each other by a common dimension of no greater than 0.25 microns. At least one of the spaced regions includes a code to define a masked read only memory (ROM) structure. The one coded spaced region causes an interference with a light source to transmit a lower intensity of light relative to any one of the spaced regions free from the coding.

20 Claims, 7 Drawing Sheets

METHOD AND STRUCTURE FOR FABRICATING PATTERNS ON PHASE SHIFT MASK FOR THE MANUFACTURE OF SEMICONDUCTOR WAFERS

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed integrated circuits and their processing for the manufacture of semiconductor devices. More particularly, the invention provides a method for manufacturing a photolithography mask for the manufacture of advanced integrated circuits such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of such a limit is an ability to manufacture the masks that are used in performing lithography for the manufacture of integrated circuits. A commonly used mask is called a phase shift mask. Phase shift masks have been used to print feature sizes of less than quarter microns using interference patterns from illumination sources. As feature sizes become smaller, such masks become ineffective. For example, patterns printed on photosensitive materials for the manufacture of read only memory devices become inaccurate and cause yield and reliability problems. These and other limitations are described throughout the present specification and more particularly below.

From the above, it is seen that an improved technique for processing semiconductor devices is desired.

BRIEF SUMMARY OF THE INVENTION

According to the present invention, techniques for the manufacture of semiconductor devices are provided. More particularly, the invention provides a method for manufacturing a photolithography mask for the manufacture of advanced integrated circuits such as dynamic random access memory devices, static random access memory devices (SRAM), application specific integrated circuit devices (ASIC), microprocessors and microcontrollers, Flash memory devices, and others.

In a specific embodiment, the invention provides a method for manufacturing a mask for integrated circuit devices. The method includes providing a mask including a surface region, which has a plurality of spaced regions forming an array configuration. Each of the spaced regions is separated from each other by an opaque region to form the array configuration and being characterized by a dimension no greater than 0.25 microns. The method includes selectively coding one or more of the spaced regions to define a masked read only memory (ROM) structure, where each of the coded spaced regions includes a structure. The structure causes an interference with light from a light source. The method also includes illuminating the surface region of the mask with the light source to allow the light to traverse through each of the spaced regions, whereupon the selectively coded one or more spaced regions transmits a lower light intensity to a photoresist material than a light intensity on the photoresist material from light illuminated on the photoresist material through the spaced regions free from the one or more codings. The method includes developing the photoresist material to selectively remove portions of the photoresist material only in the portions where light transmitted through the spaced regions free from coding while the portions of the photoresist material corresponding to the one or more coded regions remain intact.

In an alternative embodiment, the invention provides a method for manufacturing a coded mask structure. The method provides a mask substrate including a surface region, which has a plurality of spaced regions forming an array configuration. Each of the spaced regions is separated from each other by an opaque region. Each of the spaced regions is separated from each other by a common dimension of no greater than 0.25 microns. The method includes selectively coding at least one of the spaced regions to define a mask for a read only memory (ROM) structure. The one coded spaced region is capable of causing an interference with a light source to transmit a lower intensity of light relative to any one of the spaced regions free from the coding.

Still further, the invention provides a reticle structure for integrated circuit device. The structure includes a transparent substrate having a surface region and a plurality of spaced regions on the surface region. Each of the spaced regions is configured to form an array, which has a plurality of rows that intersect a plurality of columns. Each of the spaced regions is defined within a pair of rows and a pair of columns; whereupon each of the spaced regions being separated by each other by a common dimension of no greater than 0.25 microns. At least one of the spaced regions includes a code to define a masked read only memory (ROM) structure. The one coded spaced region causes an interference with a light source to transmit a lower intensity of light relative to any one of the spaced regions free from the coding.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. On the other hand, sparse (Iso) and dense coding spaced regions on the same surface region have intrinsic wafer dimension bias that will make it very difficult to do Optical Proximity Correction or even impossible to print random coding using only one mask. Therefore, the method also can reduce iso-dense bias and achieve enough common process window which is a big advantage different from current applications. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for the manufacture of semiconductor devices are provided. More particularly, the invention provides a method for manufacturing a photolithography mask for the manufacture of advanced integrated circuits such as dynamic random access memory devices, static random access memory devices (SRAM), application specific integrated circuit devices (ASIC), microprocessors and microcontrollers, Flash memory devices, and others.

Figure 1:
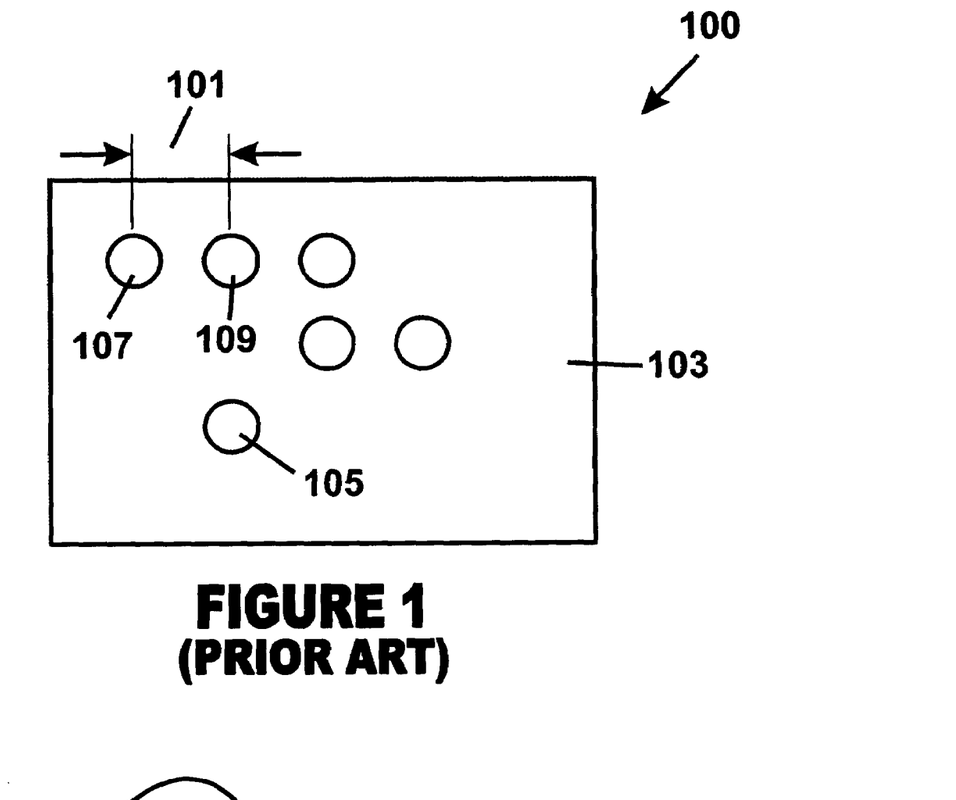
FIGS. 1 through 3 are simplified cross-sectional view diagrams illustrating a conventional process of photolithography.
Figure 2:
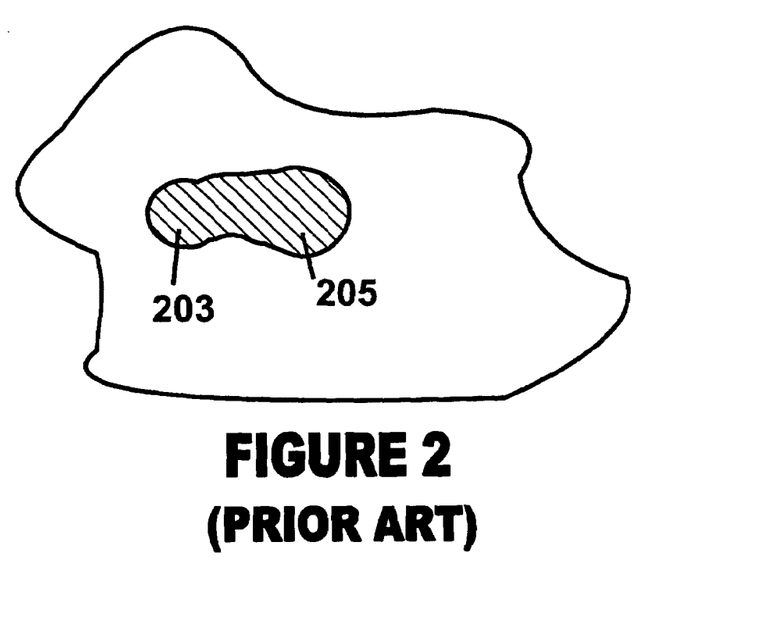
Figure 3:
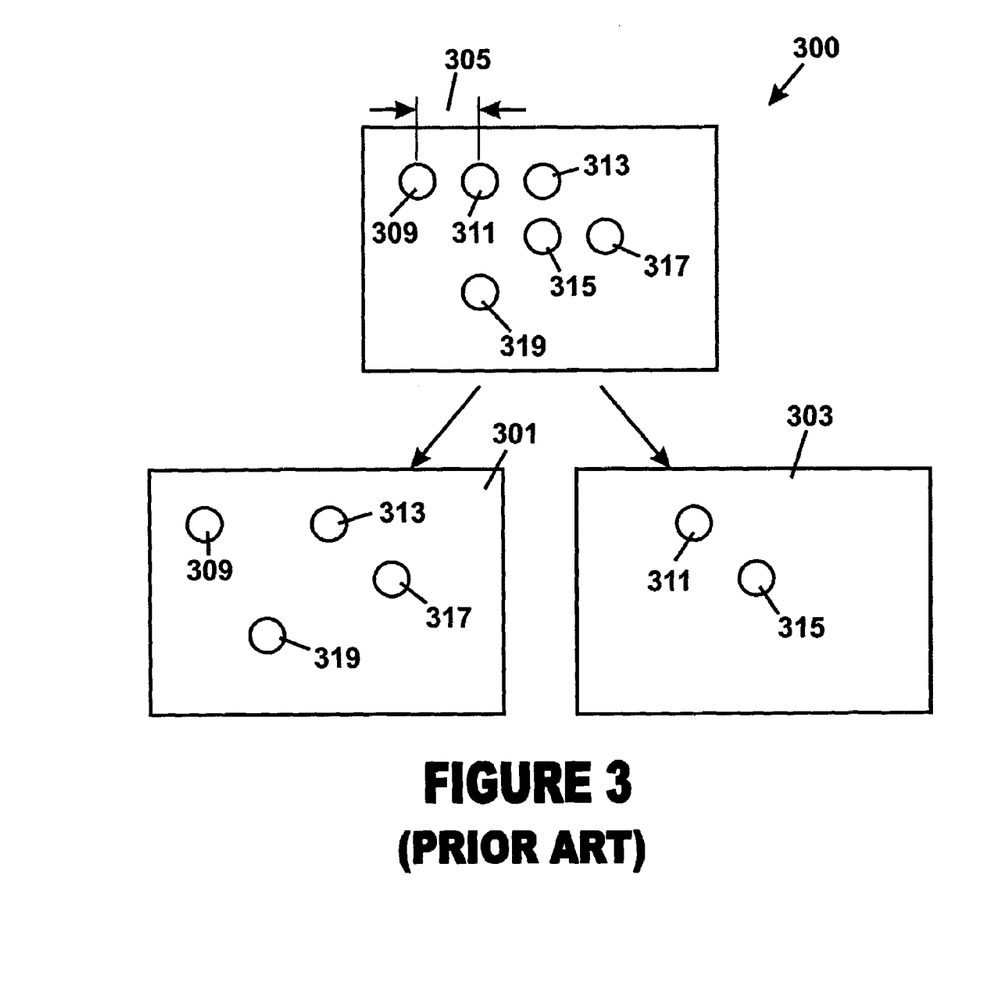

FIGS. 1 through 3 are simplified cross-sectional view diagrams illustrating a conventional process of photolithography. These diagrams are merely an example, which should not unduly limit the scope of the claims herein. One of ordinary skill in the art would recognize many limitations, variations, and alternatives. As shown, conventional mask structures 100 for semiconductor devices such as a read-only-memory device includes a patterned group of openings 107, 105, and 109. Such openings include spacing 101, which is illustrative of a critical design rule. As devices become smaller, spacing 101 becomes smaller. Another spacing such as those between pattern 109 and 105 remain larger. Many limitations exist with conventional mask structures based upon the close tolerances required for the spacing between two developed regions. Referring to FIG. 2, light illuminated into openings 107 and 109 could cause distortion on a final pattern on a photosensitive material. The distortion is caused by interference influences from light traversing through openings 107 and 109. As such, the final pattern connects developed region 203 and 205 as a single developed region, which would lead to a defective semiconductor device structure.

Conventional techniques have been developed to improve such distortion caused by close tolerances between openings in mask structures. Referring to FIG. 3, conventional mask 300, which includes openings 309, 311, 313, 315, 317, and 319, are printed on multiple mask structures 301 and 303. That is, two mask structures would include each of the openings together, where no two openings have a spacing that is the smallest spacing 305 as mask structure 300. Here, openings 309, 313, 317, and 319 would be printed on mask structure 301. Openings 311 and 315 would be printed on mask structure 303. A process for printing all of the openings onto a photosensitive material would require a double exposure process using mask structure 301 and then mask structure 303. Such double exposure process includes a use of at least two masks, which are expensive and difficult to make, and also requires precise alignment between the two masks. The precise alignment may be difficult in some applications. These and other limitations of conventional techniques are described in further detail throughout the present specification and more particularly below.

FIGS. 4–8 are simplified diagrams illustrating a method of photolithography according to an embodiment of the present invention. As shown, the method begins with an improved mask substrate 400, which includes a surface region. The surface region includes a plurality of spaced regions forming an array configuration. The array configuration includes a plurality of rows, which are parallel to each other. The array also includes a plurality of columns, which are also parallel to each other. The rows intersect the column in right angles. Such rows and columns include an overlying opaque region. A spaced region is defined between each pair of rows and a pair of columns, which intersect the pair of rows. Each of the spaced regions is separated from each other by an opaque region. Preferably, each of the spaced regions is separated by each other from a common dimension of no greater than 0.25 microns.

Figure 4:
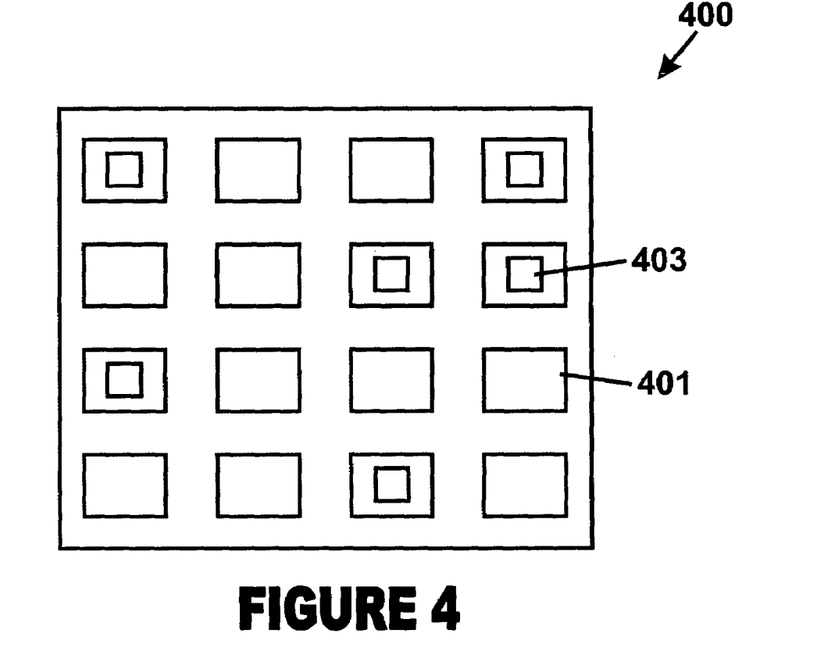
FIGS. 4–8 are simplified diagrams illustrating a method of photolithography according to an embodiment of the present invention.

As shown, the array also includes selectively coding 403 of one or more of the spaced regions to define, for example, a masked read only memory (ROM) structure. In a specific embodiment, each of the coded spaced regions includes a structure, which causes an interference with a light source. Such structure allows light to pass through the spaced region, but such light is not at an intensity sufficient to develop a photosensitive material. The light passing through the coded spaced region traverses through the mask and does not substantially interfere with light from other spaced regions.

Figure 5:
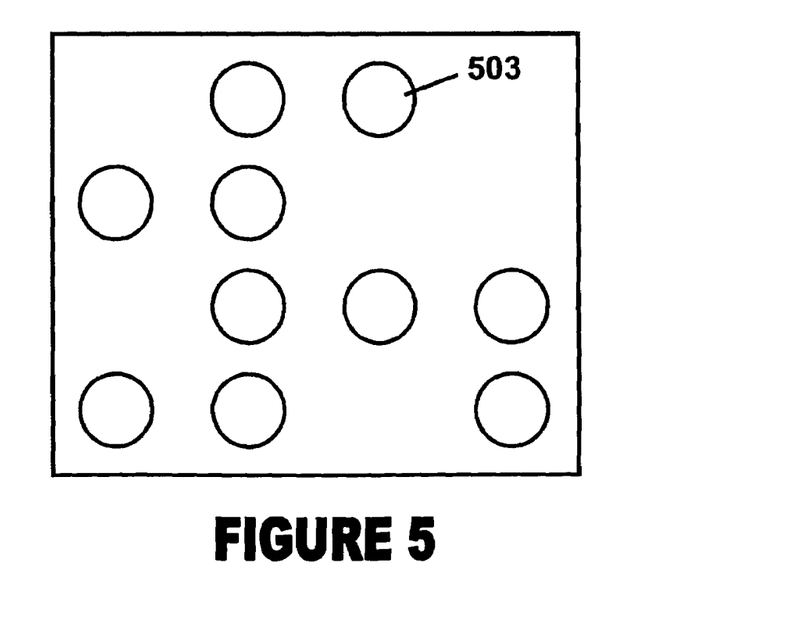

In a specific embodiment, the method illuminates light through the openings in the mask. The openings include those with structures thereon. The openings with the structures reduce the intensity of the light to prevent development of the photosensitive material. Referring to FIG. 5, the method selectively coded one or more spaced regions by transmitting a lower light intensity to certain regions of the photoresist material than the spaced regions. Such coded regions correspond to regions 503 that received light without the structures. The mask regions with the structures are free from development. The method develops the photoresist material to selectively remove certain spaced regions while other regions remain intact, whereupon the photoresist material having a threshold that develops only the photosensitive material that received light from spaced regions free from structures.

Figure 6:
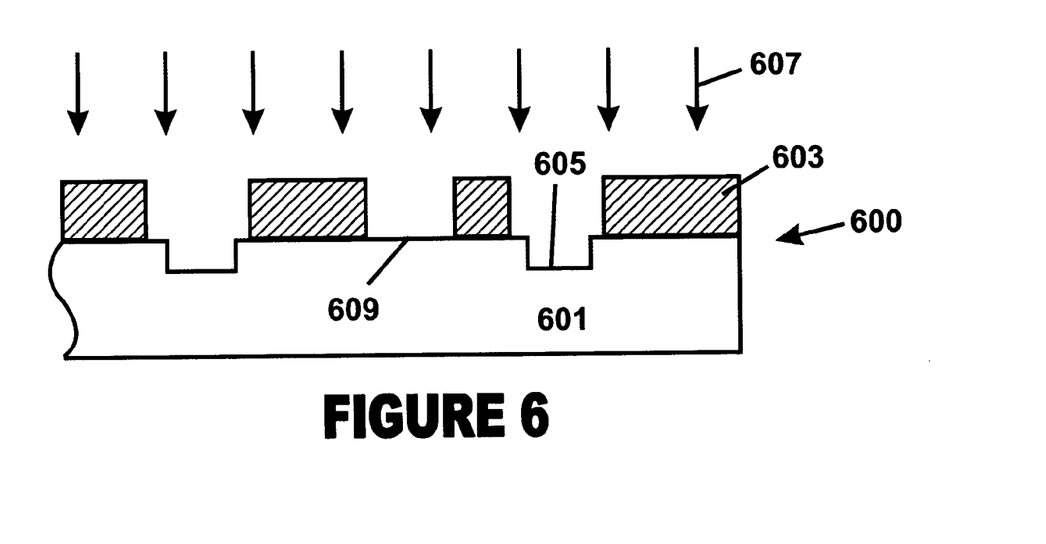
Figure 7:
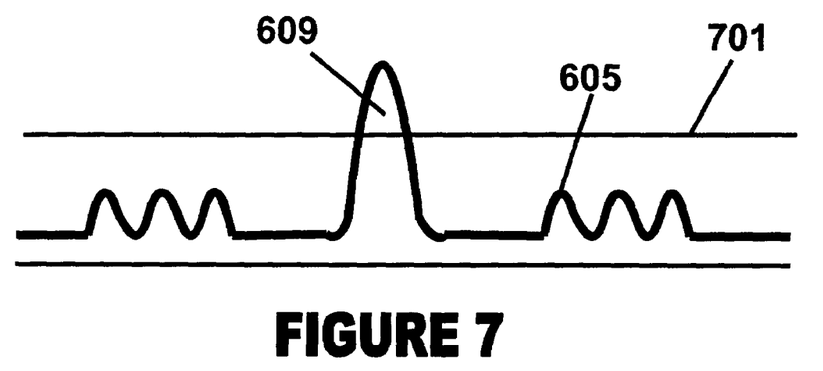
Figure 8:
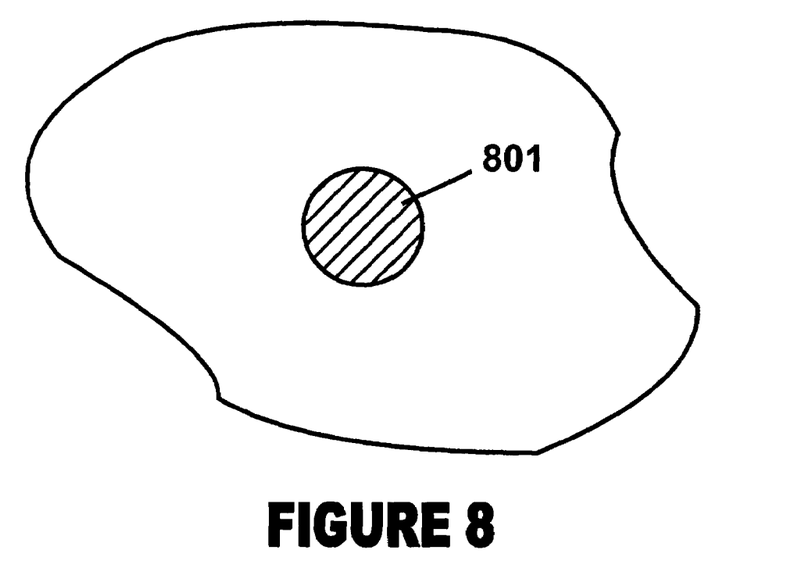
Figure 9:
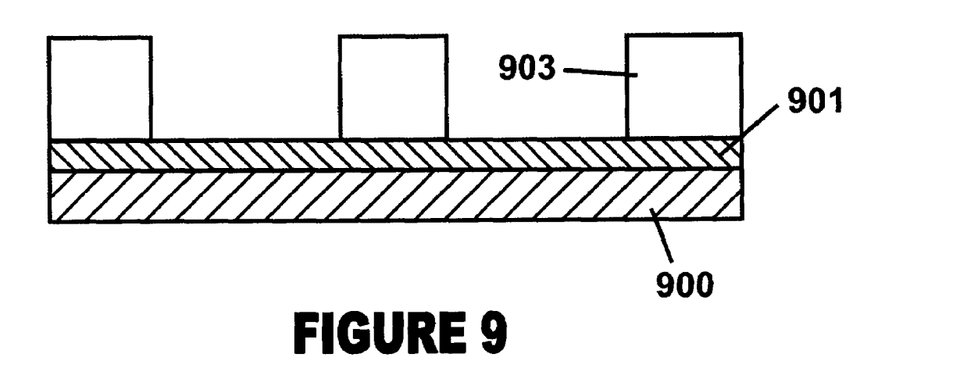
FIGS. 9–12 are simplified diagrams illustrating a process for fabricating a mask structure according to an embodiment of the present invention

FIGS. 6 through 8 are illustrative of a method of illuminating a photosensitive material according to an embodiment of the present invention. As noted, these diagrams are merely an example, which should not unduly limit the scope of the claims herein. One of ordinary skill in the art would recognize many limitations, variations, and alternatives. As shown, light 607 illuminates through one or more of the spaced regions 609 605 on a substrate 601 of mask 600, which will be used for the manufacture of integrated circuits. As also shown, the substrate also includes opaque regions 603, which form borders around each of the spaced regions. Light illuminating through spaced region 609 traverses through the substrate and forms intensity pattern 609 on FIG. 7. Intensity pattern 609 is above a threshold level 701 that is required to allow a selected photosensitive material to develop. Other spaced regions 605, which include structures that reduce intensity of illumination 605, is below the threshold level and do not develop during processing. The developed spaced regions forms a later pattern 801 in the photosensitive material, as illustrated by FIG. 8. Other regions that transmit light to the photosensitive material below the threshold level are not developed. It is believed that since a certain level of light still passes through the spaced regions with structures, interference influences between light from different spaced regions are reduced or possibly eliminated. Specific details on way of fabricating the present mask structure can be found throughout the present specification and in more detail below.

A method for fabricating a mask structure according to an embodiment of the present invention is outlined as follows:
1. Provide a quartz substrate;
2. Form an opaque film overlying the quartz substrate;
3. Form a photoresist layer overlying the opaque film;
4. Expose the photoresist layer to form a plurality of spaced patterns that form an array configuration;
5. Develop the photoresist layer to form openings for a mask ROM pattern;
6. Etch the opaque film through the openings in the developed photoresist to expose spaced regions in the quartz substrate;
7. Strip the photoresist film;
8. Form a photoresist layer overlying the patterned opaque film and exposed quartz substrate;
9. Expose the photoresist layer for an interference structure in selected spaced regions in the quartz substrate;
10. Develop the photoresist layer to form openings for the interference structure in the selected spaced regions;
11. Etch the exposed quartz in the selected spaced patterns through the openings in the developed photoresist to code the selected spaced regions;
12. Strip the photoresist film; and
13. Perform other steps, as desired.

The above sequence of steps provides a method for fabricating a photolithography mask according to an embodiment of the present invention. As shown, such steps include patterning a ROM mask and selectively coding the ROM mask according to a specific embodiment. Further details of the present invention can be found throughout the present specification and more particularly according to the Figures described below.

FIGS. 9–12 are simplified cross-sectional view diagrams illustrating a method of fabricating a mask according to an embodiment of the present invention. These diagrams are merely an illustration, which should not unduly limit the scope of the claims herein. One of ordinary skill in the art would recognize many other variations, modifications, and alternatives. As shown, the method begins by providing a quartz substrate 900. The quartz substrate is the preferred starting material, although other materials that exhibit similar light transmission characteristics may also be used. The substrate includes an overlying film of chrome material 901. Other materials such as ZrSiO, MoSiO, and MoSiON can also be used. Preferably, deposition techniques such as sputtering, plating, or plasma deposition may be used to deposit the chrome material. The method forms a photoresist layer 903 overlying the chrome film. The method exposes the photoresist layer and exposed regions are removed via development. Openings are formed in the photoresist layer for a mask pattern, such as a ROM mask pattern.

Figure 10:
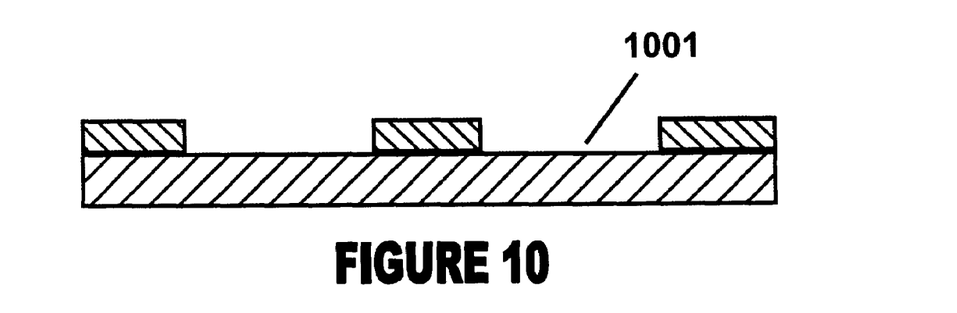

The method then etches the chrome film through the openings in the photoresist layer, as illustrated by FIG. 10. Preferably, dry etching techniques can be used. As merely an example, such dry etching techniques include, among others, reactive ion etching, inductive coupled plasma etching, and reactive plasma etching. Plasma etching selectively removes 1001 the film without damaging the quartz substrate. The quartz substrates acts as an etch stop in the etching process of the film. The etched film is now patterned to form the mask pattern, which will be used in the manufacture of integrated circuits. The method then strips the photoresist film. Stripping often occurs using ashers employing an oxygen bearing plasma, which can be mixed with water. Of course, the particular stripping technique depends upon other factors.

Figure 11:
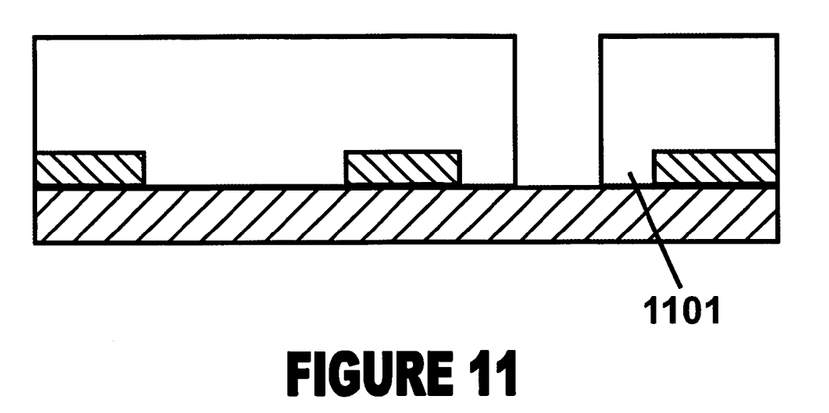
Figure 12:
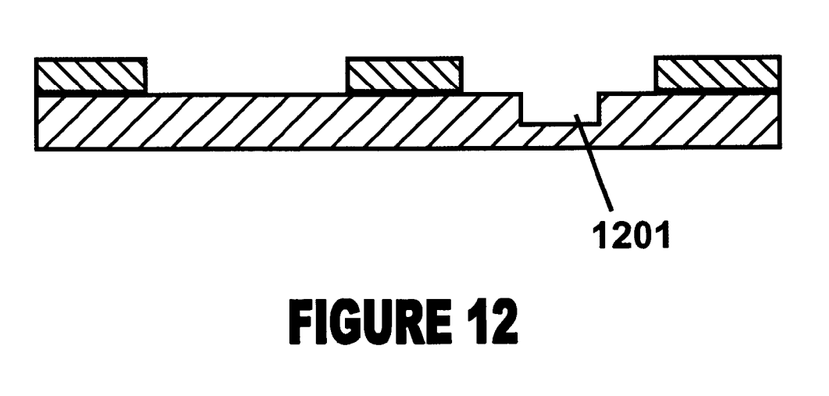

The method forms a photoresist layer 1101 overlying the patterned chrome film and exposed quartz substrate. The method exposes the photoresist layer and exposed regions are removed via development. Here, the method exposes the photoresist layer for an interference structure in selected spaced regions in the quartz substrate. The photoresist layer is developed to form openings for the interference structure in the selected spaced regions. As shown, the photoresist layer covers all of the patterned chrome film and a portion of the quartz substrate to print the interference pattern on the selected spaced regions. The method etches the exposed quartz in the selected spaced patterns through the openings in the developed photoresist to code the selected spaced regions, as illustrated in FIG. 12. Preferably, dry etching techniques can be used. As merely an example, such dry etching techniques include, among others, reactive ion etching, inductive coupled plasma etching, and reactive plasma etching. As merely an example, the etched quartz can shift the phase of the light traversing through the portion of the quartz with the structure. Such shift in phase results in a lower transmission intensity of light relative to other portions of the quartz that are free from the structure. Plasma etching selectively removes 1201 portions of the quartz to form structures. The method then strips the photoresist film. Stripping often occurs using ashers employing an oxygen bearing plasma, which can be mixed with water. Of course, the particular stripping technique depends upon other factors.

Although the above has been illustrated according to a specific embodiment, there can be other modifications, alternatives, and variations. For example, boron has been used as an impurity, but other impurities such as phosphorus, and arsenic can also be used. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a mask for integrated circuit devices, the method comprising:
   providing a mask including a surface region, the surface region including a plurality of spaced regions forming an array configuration, each of the spaced regions being separated from each other by an opaque region to form the array configuration and being characterized by a dimension no greater than 0.25 microns;
   selectively coding one or more of the spaced regions to define a masked read only memory (ROM) structure, each of the coded spaced regions including a structure, the structure causing an interference with light from a light source;
   illuminating the surface region of the mask with the light source to allow the light to traverse through each of the spaced regions, whereupon the selectively coded one or more spaced regions transmits a lower light intensity to a photoresist material than a light intensity on the photoresist material from light illuminated on the photoresist material through the spaced regions free from the one or more codings; and
   developing the photoresist material to selectively remove portions of the photoresist material only in the portions where light transmitted through the spaced regions free from coding while the portions of the photoresist material corresponding to the one or more coded regions remain intact.

2. The method of claim 1 wherein the structure is selected from a shifter or an anti-scattering bar.

3. The method of claim 1 wherein the one or more coded regions is characterized by a lower transmission rate than a transmission rate of the spaced regions free from coding.

4. The method of claim 1 wherein the integrated circuit device is a masked ROM.

5. The method of claim 1 wherein the photoresist material is overlying a semiconductor substrate.

6. The method of claim 1 further comprising processing exposed regions of the photoresist material.

7. The method of claim 1 wherein the light source is KrF source.

8. The method of claim 1 wherein the illuminating is a single exposure to form the ROM structure.

9. The method of claim 1 wherein the opaque region is MoSi or chromium.

10. The method of claim 1 wherein each of the spaced regions is characterized by a length of 0.2 microns.

11. A method for manufacturing a coded mask structure, the method comprising:
    providing a mask substrate including a surface region, the surface region including a plurality of spaced regions forming an array configuration, each of the spaced regions being separated from each other by an opaque region, each of the spaced regions being separated by each other by a common dimension of no greater than 0.25 microns; and
    selectively coding at least one of the spaced regions to define a mask for a read only memory (ROM) structure, the one coded spaced region being capable of causing an interference with a light source to transmit a lower intensity of light relative to any one of the spaced regions free from the coding.

12. The method of claim 11 wherein the coded spaced region including a structure, the structure being selected from a shifter or an anti-scatter bar.

13. The method of claim 11 further comprising using the mask for manufacturing a read only memory device.

14. The method of claim 11 further comprising illuminating a light from a KrF source through each of the spaced regions to form a pattern on a photosensitive material.

15. The method of claim 14 wherein the photosensitive material comprises a threshold.

16. The method of claim 11 wherein the mask substrate comprises a quartz material.

17. The method of claim 11 wherein each of the spaced regions includes a characteristic dimension of less than 0.2 microns.

18. The method of claim 11 wherein the opaque region comprises a chrome material.

19. A reticle structure for integrated circuit device, the reticle comprising:
    a transparent substrate having a surface region;
    a plurality of spaced regions on the surface region, each of the spaced regions being configured to form an array, the array having a plurality of rows that intersect a plurality of columns, each of the spaced regions being defined within a pair of rows and a pair of columns; whereupon each of the spaced regions being separated by each other by a common dimension of no greater than 0.25 microns; and
    at least one of the spaced regions including a code to define a masked read only memory (ROM) structure, the one coded spaced region causes an interference with a light source to transmit a lower intensity of light relative to any one of the spaced regions free from the coding.

20. The reticle structure of claim 19 wherein the lower intensity of light prevents development of a photosensitive material.

* * * * *